US009607844B2

(12) United States Patent
Okuda et al.

(10) Patent No.: US 9,607,844 B2
(45) Date of Patent: Mar. 28, 2017

(54) SUBSTRATE PROCESSING METHOD AND SUBSTRATE PROCESSING APPARATUS

(71) Applicant: SCREEN Holdings Co., Ltd., Kyoto (JP)

(72) Inventors: Jiro Okuda, Kyoto (JP); Toyohide Hayashi, Kyoto (JP); Naohiko Yoshihara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/861,490

(22) Filed: Sep. 22, 2015

(65) Prior Publication Data
US 2016/0093516 A1 Mar. 31, 2016

(30) Foreign Application Priority Data

Sep. 29, 2014 (JP) ................. 2014-198142
Aug. 11, 2015 (JP) ................. 2015-159088

(51) Int. Cl.
B44C 1/22 (2006.01)
C03C 15/00 (2006.01)
C03C 25/68 (2006.01)
C23F 1/00 (2006.01)
H01L 21/306 (2006.01)
H01L 21/67 (2006.01)

(52) U.S. Cl.
CPC .... H01L 21/30604 (2013.01); H01L 21/6715 (2013.01)

(58) Field of Classification Search
CPC .............. H01L 21/6715; H01L 21/30604
USPC ........................................ 216/83, 92
See application file for complete search history.

(56) References Cited

U.S. PATENT DOCUMENTS

2010/0200547 A1* 8/2010 Higashijima ..... H01L 21/67034
216/92

FOREIGN PATENT DOCUMENTS

JP 2005-302746 10/2005

* cited by examiner

Primary Examiner — Roberts Culbert
(74) Attorney, Agent, or Firm — Ostrolenk Faber LLP

(57) ABSTRACT

The method includes holding a substrate horizontally with a holding and rotating mechanism; introducing processing liquid from a fluid introduction portion of, in a processing liquid pipe in which a processing liquid nozzle having a discharge port at a tip end is provided at one end, the other end of the processing liquid pipe into the processing liquid pipe so as to discharge the processing liquid from the discharge port toward the substrate; introducing, after stopping the processing liquid discharge step, a gas from the fluid introduction portion into the processing liquid pipe so as to extrude the processing liquid within the processing liquid pipe and within the processing liquid nozzle outwardly; and stopping, after starting the introduction of the gas, the introduction of the gas into the processing liquid pipe with the processing liquid being left within the processing liquid pipe and/or the processing liquid nozzle.

4 Claims, 6 Drawing Sheets

SUBSTRATE PROCESSING METHOD AND SUBSTRATE PROCESSING APPARATUS

BACKGROUND OF THE INVENTION

1. Field of the Invention

This invention relates to a substrate processing method and a substrate processing apparatus for processing using a processing liquid on a substrate to be processed. Examples of the substrate to be processed include a semiconductor wafer, a glass substrate for a liquid crystal display device, a substrate for a plasma display, a substrate for an FED (Field Emission Display), a substrate for a photomask, a substrate for an optical disc, a substrate for a magnetic disc, a substrate for a magnetic optical disc, a ceramic substrate and a substrate for a solar cell.

2. Description of Related Art

In the manufacturing process of a semiconductor device or a liquid crystal display device, on a substrate such as a semiconductor wafer or a liquid crystal display panel glass substrate, processing using a processing liquid such as a chemical liquid or a rinse liquid is performed. A substrate processing apparatus of a single substrate processing type adopted to perform processing a single substrate at a time with a processing liquid includes a spin chuck which holds the substrate substantially horizontally and rotates it and a processing liquid nozzle which supplies the processing liquid to the substrate held by the spin chuck. A processing liquid pipe is connected to the processing liquid nozzle.

Japanese Unexamined Patent Application Publication No. 2005-302746 discloses an arrangement in which in order to prevent a processing liquid from dripping from a processing liquid nozzle, nitrogen is introduced into a processing liquid pipe through a mixing valve. By the nitrogen introduced into the processing liquid pipe, the processing liquid present within the processing liquid nozzle and within the processing liquid pipe is extruded and is discharged from the processing liquid nozzle. The introduction of the nitrogen into the processing liquid pipe is continued until the processing liquid is completely discharged from the interior of the processing liquid nozzle and the interior of the processing liquid pipe.

SUMMARY OF THE INVENTION

However, in the extrusion processing by the introduction of nitrogen, the substrate (semiconductor wafer) is disadvantageously damaged by blowing the gas (nitrogen gas) onto the substrate.

Specifically, when the processing liquid left in the processing liquid pipe and the processing liquid nozzle is removed, only the gas is discharged from the discharge port of the processing liquid nozzle, and the gas is directly blown onto the substrate. When the gas is blown onto the substrate, the quality of the processing the substrate may be lowered.

More specifically, the gas is blown onto the substrate, and thus the vicinity of the center portion of the substrate is dried, the droplets of the chemical liquid are dispersed, and the uniformity of the chemical liquid processing may be degraded and that particles may be produced on the substrate.

Hence, an object of the present invention is to provide a substrate processing method and a substrate processing apparatus that can efficiently remove, by the introduction of gas, a processing liquid left within a processing liquid nozzle and a processing liquid pipe while preventing the gas from being blown onto a substrate.

The present invention provides a substrate processing method of performing processing using processing liquid on a substrate to be processed, the method including a substrate holding step of holding the substrate in a horizontal position with a substrate holding and rotating mechanism, a processing liquid discharge step of introducing processing liquid from a fluid introduction portion of, in a processing liquid pipe in which a processing liquid nozzle having a discharge port at a tip end is provided at one end, the other end of the processing liquid pipe into the processing liquid pipe so as to discharge the processing liquid from the discharge port toward the substrate, a gas extrusion step of introducing, after stop of the processing liquid discharge step, a gas from the fluid introduction portion into the processing liquid pipe so as to extrude the processing liquid within the processing liquid pipe and within the processing liquid nozzle outwardly, and a gas introduction stop step of stopping, after the start of the introduction of the gas, the introduction of the gas into the processing liquid pipe in a state where the processing liquid is left within the processing liquid pipe and/or the processing liquid nozzle.

According to this method, after the stop of the discharge of the processing liquid from the discharge port of the processing liquid nozzle to the substrate, the gas is introduced from the fluid introduction portion into the processing liquid pipe, and thus the processing liquid within the processing liquid pipe and within the processing liquid nozzle is extruded outwardly (the gas extrusion step). In this case, in a state where the processing liquid is left within the processing liquid pipe and/or the processing liquid nozzle, that is, before the processing liquid is completely extruded from the interiors of the processing liquid pipe and the processing liquid nozzle, the introduction of the gas into the processing liquid pipe is stopped. Hence, in the gas extrusion step, it is possible to prevent the gas introduced into the processing liquid pipe from being directly blown onto the substrate.

After the completion of the gas extrusion step, the processing liquid is left on at least the tip end portion of the processing liquid nozzle. Since the processing liquid functions as a so-called lid of the processing liquid nozzle, it is possible to prevent the gas from leaking through the discharge port of the processing liquid nozzle.

In a preferred embodiment of this invention, in the gas introduction stop step, in a state where the processing liquid is left on the tip end portion of the processing liquid nozzle, the introduction of the gas into the processing liquid pipe is stopped.

According to this method, in a state where the processing liquid is left on the tip end portion of the processing liquid nozzle, the introduction of the gas into the processing liquid pipe is stopped. Since the processing liquid left on parts of the processing liquid pipe and the processing liquid nozzle other than the tip end portion of the processing liquid nozzle is removed, after the completion of the gas extrusion step, on a large proportion of the processing liquid pipe and the processing liquid nozzle, no processing liquid is present. In this way, it is possible to effectively reduce the liquid dripping of the processing liquid from the discharge port of the processing liquid nozzle.

A processing liquid collection step of collecting, together with the gas extrusion step, from a collection flow path, the processing liquid removed from the substrate may further be included.

According to this method, it is possible to avoid adverse effects caused by blowing the gas onto the substrate, and it is also possible to collect, from the collection flow path, the processing liquid discharged from the discharge port of the processing liquid nozzle onto the substrate in the gas extrusion step. Some kinds of chemical liquid used in a semiconductor manufacturing step and the like are expensive, and such a chemical liquid can be used as the processing liquid. In this case, the chemical liquid left in the processing liquid pipe and the processing liquid nozzle can be collected, and thus it is possible to reduce the operation cost.

When the processing liquid contains a chemical liquid, the substrate processing method may further include a rinse liquid discharge step of introducing, after the gas introduction stop step, a rinse liquid from the fluid introduction portion into the processing liquid pipe so as to discharge the rinse liquid from the discharge port toward the substrate.

According to this method, the chemical liquid is introduced into the processing liquid pipe so as to discharge the chemical liquid from the processing liquid nozzle, and after the discharge, the gas extrusion step is performed. Following the gas extrusion step, the rinse liquid is introduced into the processing liquid pipe, and the rinse liquid is discharged from the discharge port of the processing liquid nozzle. In this case, although the gas extrusion step is performed after the processing using the chemical liquid until the processing using the rinse liquid is started, the gas is prevented from being blown onto the substrate. Hence, it is possible to avoid various adverse effects caused by blowing the gas onto the substrate.

In this case, although at the time of start of the rinse liquid discharge step, the chemical liquid and the gas left in the processing liquid nozzle and/or the processing liquid pipe are blown onto the substrate together with the rinse liquid, since a relatively small amount of processing liquid is left, and the chemical liquid is diluted with the following rinse liquid, with the result that the substrate is hardly adversely affected by the supply of the chemical liquid left. Since the pressure of the gas left within the processing liquid pipe and the processing liquid nozzle is not high, it is possible to practically ignore adverse effects such as the drying and contamination of the substrate caused by the blowing of the gas onto the substrate.

The present invention provides a substrate processing apparatus including a substrate holding and rotating mechanism which rotates a substrate while holding the substrate in a horizontal position, a processing liquid nozzle which has, at a tip end, a discharge portion from which processing liquid is discharged toward the substrate held by the substrate holding and rotating mechanism, a processing liquid pipe in which the processing liquid nozzle is provided at one end and a fluid introduction portion that introduces the processing liquid is provided at the other end, a processing liquid supply pipe which is connected to the fluid introduction portion and which supplies the processing liquid to the processing liquid pipe, a processing liquid valve which opens and closes the processing liquid pipe, a gas pipe which is connected to the fluid introduction portion and which supplies a gas to the processing liquid pipe, a gas valve which opens and closes the processing liquid pipe, and a control unit which performs a processing liquid discharge step of opening the processing liquid valve to introduce the processing liquid from the fluid introduction portion into the processing liquid pipe so as to discharge the processing liquid from the discharge port toward the substrate, a gas extrusion step of opening, after closing the processing liquid valve to stop the processing liquid discharge step, the gas valve to introduce the gas from the fluid introduction portion into the processing liquid pipe so as to extrude the processing liquid within the processing liquid pipe and within the processing liquid nozzle outwardly, and a gas introduction stop step of opening, after the start of the introduction of the gas, the gas valve in a state where the processing liquid is left within the processing liquid pipe and/or the processing liquid nozzle so as to stop the introduction of the gas into the processing liquid pipe.

According to this arrangement, after the stop of the discharge of the processing liquid from the discharge port of the processing liquid nozzle to the substrate, the gas is introduced from the fluid introduction portion into the processing liquid pipe, and thus the processing liquid within the processing liquid pipe and within the processing liquid nozzle is extruded outwardly (the gas extrusion step). In this case, in a state where the processing liquid is left within the processing liquid pipe and/or the processing liquid nozzle, that is, before the processing liquid is completely extruded from the interiors of the processing liquid pipe and the processing liquid nozzle, the introduction of the gas into the processing liquid pipe is stopped. Hence, in the gas extrusion step, it is possible to prevent the gas introduced to the processing liquid pipe from being directly blown onto the substrate.

After the completion of the gas extrusion step, the processing liquid is left on at least the tip end portion of the processing liquid nozzle. Since the processing liquid functions as a so-called lid of the processing liquid nozzle, it is possible to prevent the gas from leaking through the discharge port of the processing liquid nozzle.

In a preferred embodiment of this invention, in a state where the processing liquid is left on the tip end portion of the processing liquid nozzle, the control unit stops the introduction of the gas into the processing liquid pipe.

According to this arrangement, in a state where the processing liquid is left on the tip end portion of the processing liquid nozzle, the introduction of the gas into the processing liquid pipe is stopped. Since the processing liquid left on parts of the processing liquid pipe and the processing liquid nozzle other than the tip end portion of the processing liquid nozzle is removed, after the completion of the gas extrusion step, on a large proportion of the processing liquid pipe and the processing liquid nozzle, no processing liquid is present. In this way, it is possible to effectively reduce the liquid dripping of the processing liquid from the discharge port of the processing liquid nozzle.

A pressure gas tank which can accommodate the gas and which is interposed in the gas pipe may further be included.

According to this arrangement, since the pressure gas tank which can accommodate the gas and which is provided on the gas pipe is included, with this pressure gas tank, it is possible to control with a high degree of accuracy the amount of gas introduced into the processing liquid pipe.

A rinse liquid pipe which is connected to the fluid introduction portion and which supplies a rinse liquid to the processing liquid pipe may further be included.

A processing liquid collection mechanism which guides the processing liquid extruded toward the substrate to a collection flow path may further be included.

According to this arrangement, it is possible to avoid adverse effects caused by blowing the gas onto the substrate, and it is also possible to collect, from the collection flow path, the processing liquid discharged from the processing liquid nozzle onto the substrate in the gas extrusion step. Some kinds of chemical liquid used in a semiconductor manufacturing step and the like are expensive, and when such a chemical liquid is used as the processing liquid, the chemical liquid left in the processing liquid pipe and the processing liquid nozzle can be collected. Thus it is possible to reduce the operation cost of the apparatus.

An opening adjustment valve which adjusts an opening of the gas pipe may further be included. In this case, the control unit may store a recipe, and the control unit may open and close the gas valve and adjust the opening of the opening adjustment valve based on the recipe.

The object of the present invention described above, further other objects, features and effects will be more obvious from the description of preferred embodiments discussed below with reference to the accompanying drawings.

DETAILED DESCRIPTION OF PREFERRED EMBODIMENTS

Figure 1:
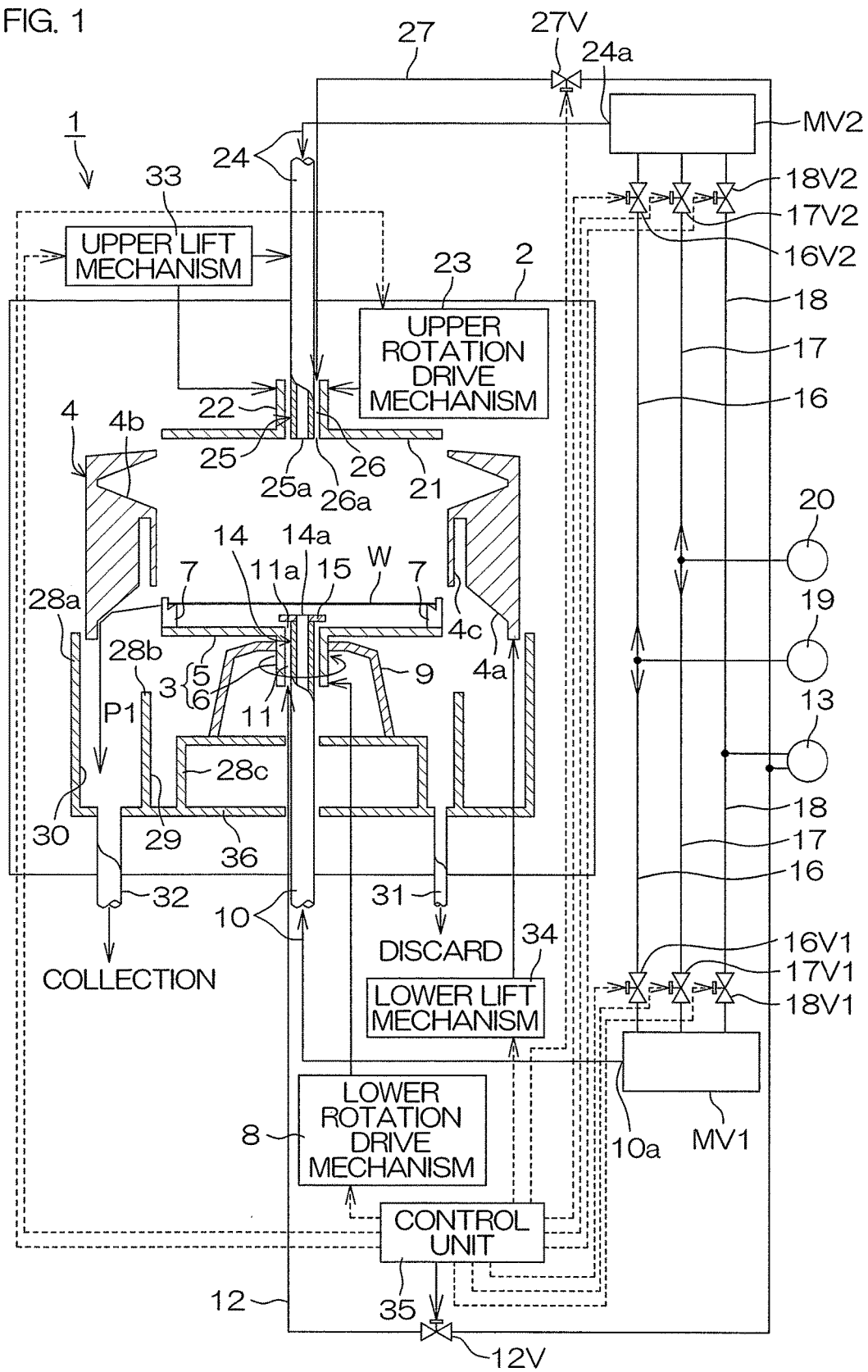
FIG. 1 is a schematic diagram of a substrate processing apparatus according to a preferred embodiment of the present invention.
Figure 2:
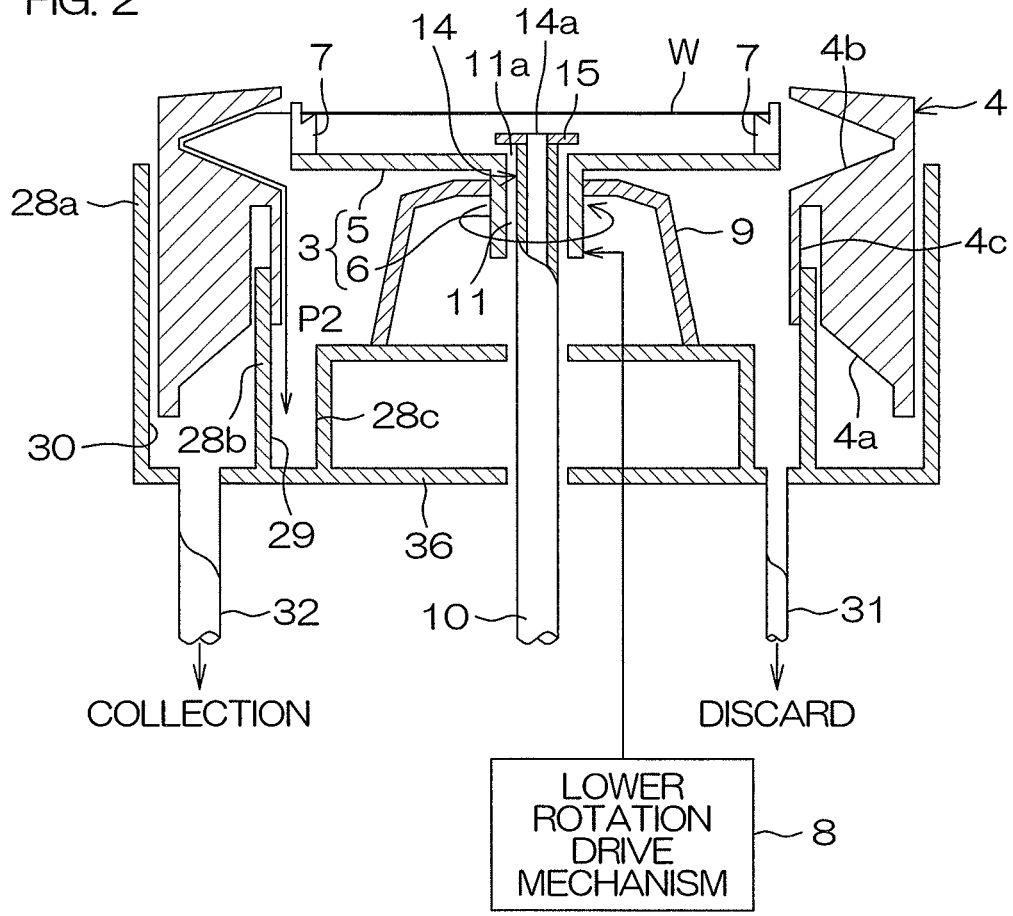
FIG. 2 is a schematic diagram of the main portion of the substrate processing apparatus according to the preferred embodiment of the present invention.

FIG. 1 is a schematic diagram of a substrate processing apparatus 1 according to a preferred embodiment of the present invention. FIG. 2 is a schematic diagram of the substrate processing apparatus 1 according to the preferred embodiment of the present invention. FIG. 1 shows a state where a splash guard 4 is in a raised position, and FIG. 2 shows a state where the splash guard 4 is in a lowered position.

The substrate processing apparatus 1 is of a single substrate processing type adopted to process disc-shaped substrates W such as semiconductor wafers W (hereinafter simply referred to as "wafers W") with a processing liquid (a chemical liquid and a rinse liquid) at a time.

The substrate processing apparatus 1 includes a box-shaped chamber 2 that has an internal space, a spin chuck 3 that is provided within the chamber 2, that holds one wafer W in a substantially horizontal position and that rotates the wafer W about a vertical rotation shaft line passing through the center of the wafer W and the annular splash guard 4 that is arranged in plan view so as to surround the spin chuck 3.

The spin chuck 3 includes a disc-shaped spin base 5 that is arranged substantially horizontally and a rotation shaft 6 that is attached to the center portion of the lower surface of the spin base 5 substantially perpendicularly to the spin base 5 and that has a central axis along a substantially vertical direction. On the peripheral edge portion of the upper surface of the spin base 5, a plurality of chuck pins 7 are disposed on the circumference corresponding to the outer circumferential shape of the wafer W at intervals. The chuck pin 7 can support the peripheral edge portion of the wafer W, makes contact with the end face of the wafer W, coordinates with the other chuck pins 7 and can clamp the wafer W. The wafer W is supported by the spin chuck 3 such that the central axis line axis thereof coincides with the central axis of the rotation shaft 6.

A lower rotation drive mechanism 8 for rotating the rotation shaft 6 about its central axis is coupled to the rotation shaft 6, and thus the wafer W held by the spin chuck 3 can be rotated by the lower rotation drive mechanism 8 within a substantially horizontal plane. The lower rotation drive mechanism 8 is disposed below the spin base 5, and is protected from the processing liquid (the chemical liquid and the rinse liquid) by a hood 9. The rotation shaft 6 is formed in the shape of a tube, and a lower processing liquid pipe 10 for passing the processing liquid is inserted through the interior of the rotation shaft 6. Between the inner wall surface of the rotation shaft 6 and the lower processing liquid pipe 10, a gap forming a nitrogen gas supply path 11 is formed. The upper end of the nitrogen gas supply path 11 is opened as a nitrogen gas discharge port 11a between the spin base 5 and the lower processing liquid pipe 10.

A nitrogen gas (an example of an inert gas) from a nitrogen gas supply source 13 can be introduced from below the nitrogen gas supply path 11 through a nitrogen gas pipe 12. A valve 12V is interposed in the nitrogen gas pipe 12. The valve 12V is opened, and thus it is possible to discharge the nitrogen gas from the nitrogen gas discharge port 11a.

One end of the lower processing liquid pipe 10 slightly protrudes from the upper surface of the spin base 5, and this protrusion portion forms a lower processing liquid nozzle 14 that discharges the processing liquid. A flange 15 is provided in the peripheral edge portion of the tip end of the lower processing liquid nozzle 14. The flange 15 covers the upper side of the nitrogen gas discharge port 11a, and thus the processing liquid discharged from the lower processing liquid nozzle 14 is prevented from entering the nitrogen gas discharge port 11a.

The other end of the lower processing liquid pipe 10 forms a fluid introduction portion 10a for introducing the processing liquid and the nitrogen gas. A mixing valve MV1 is connected to the fluid introduction portion 10a. A chemical liquid pipe 16, a rinse liquid pipe 17 and a nitrogen gas pipe 18 are connected to the mixing valve MV1. The interior of the lower processing liquid pipe 10, the interior of the chemical liquid pipe 16, the interior of the rinse liquid pipe 17 and the interior of the nitrogen gas pipe 18 communicate with each other through the interior of the mixing valve MV1. A chemical liquid supply source 19 in which the chemical liquid is stored is connected to the chemical liquid pipe 16. A rinse liquid supply source 20 in which the rinse liquid (for example, pure water such as deionized water) is stored is connected to the rinse liquid pipe 17. The nitrogen gas supply source 13 is connected to the nitrogen gas pipe 18.

The chemical liquid supplied from the chemical liquid supply source 19 to the chemical liquid pipe 16 is a liquid that contains at least one of, for example, sulfuric acid, acetic acid, nitric acid, hydrochloric acid, hydrofluoric acid, ammonia water, hydrogen peroxide water, organic acids (such as citric acid and oxalic acid), organic alkalis (such as TMAH: tetramethyl ammonium hydroxide), organic solvents (such as IPA: isopropyl alcohol), a surfactant and a corrosion inhibitor.

In the chemical liquid pipe 16, a valve 16V1 is interposed in the vicinity of a connection portion to the mixing valve MV1. The valve 16V1 is opened, and thus the chemical liquid flowing through the chemical liquid pipe 16 can be introduced through the mixing valve MV1 into the lower processing liquid pipe 10. In the rinse liquid pipe 17, a valve 17V1 is interposed in the vicinity of a connection portion to the mixing valve MV1. The valve 17V1 is opened, and thus the rinse liquid flowing through the rinse liquid pipe 17 can be introduced through the mixing valve MV1 into the lower processing liquid pipe 10. In the nitrogen gas pipe 18, a valve 18V1 is interposed in the vicinity of a connection portion to the mixing valve MV1. The valve 18V1 is opened, and thus the nitrogen gas flowing through the nitrogen gas pipe 18 can be introduced through the mixing valve MV1 into the lower processing liquid pipe 10. By the valves 16V1, 17V1 and 18V1, the fluid that is introduced into the lower processing liquid pipe 10 can be switched between the chemical liquid, the rinse liquid and the nitrogen gas.

The valves 17V1 and 18V1 are closed and the valve 16V1 is opened, and thus only the chemical liquid is supplied into the lower processing liquid pipe 10, and the chemical liquid is discharged from the lower processing liquid nozzle 14. The valves 16V1 and 18V1 are closed and the valve 17V1 is opened, and thus only the rinse liquid is supplied into the lower processing liquid pipe 10, and the rinse liquid is discharged from the lower processing liquid nozzle 14. The valves 16V1 and 17V1 are closed and the valve 18V1 is opened, and thus only the nitrogen gas is supplied into the lower processing liquid pipe 10. In a state where the processing liquid is present within the lower processing liquid pipe 10 and within the lower processing liquid nozzle 14 (hereinafter referred to as "within the lower processing liquid pipe 10 and the lower processing liquid nozzle 14"), the nitrogen gas is supplied into the lower processing liquid pipe 10, and thus the processing liquid within the lower processing liquid pipe 10 and the lower processing liquid nozzle 14 is extruded by the nitrogen gas, with the result that the processing liquid can be discharged from the lower processing liquid nozzle 14.

The valve 18V1 includes a valve body within which a valve seat is provided, a valve member which opens and closes the valve seat and an actuator which moves the valve member between an opened positon and a closed position. The valve member is moved between the opened position and the closed position, and thus the opening and closing of the valve 18V1 are switched. The position of the opened positon of the valve member is changed, and thus the opening (the gap between the valve member and the valve seat in the opened position) of the valve 18V1 can be changed. The opening of the valve 18V1 is adjusted, and thus the flow rate of nitrogen gas supplied to the lower processing liquid pipe 10 can be adjusted.

Above the spin chuck 3, a disc-shaped interruption plate 21 that has substantially the same diameter as the wafer W or a larger diameter than the wafer W is disposed substantially horizontally. A rotation shaft 22 having a central axis along a substantially vertical direction is attached to the center portion of the upper surface of the interruption plate 21 substantially perpendicularly to the interruption plate 21. The central axis of the rotation shaft 22 and the central axis of the rotation shaft 6 are present on substantially the same straight line.

An upper rotation drive mechanism. 23 is coupled to the rotation shaft 22. By the upper rotation drive mechanism 23, the interruption plate 21 can be rotated within a substantially horizontal plane in the same direction as the spin chuck 3 at substantially the same number of revolutions.

The rotation shaft 22 is formed in the shape of a tube, and an upper processing liquid pipe 24 for passing the processing liquid is inserted through the interior of the rotation shaft 22. Between the inner wall surface of the rotation shaft 22 and the upper processing liquid pipe 24, a gap forming a nitrogen gas supply path 26 is formed. The lower end of the nitrogen gas supply path 26 is opened as a nitrogen gas discharge port 26a between the interruption plate 21 and the upper processing liquid pipe 24.

The nitrogen gas (an example of an inert gas) from the nitrogen gas supply source 13 can be introduced from above the nitrogen gas supply path 26 through a nitrogen gas pipe 27. A valve 27V is interposed in the nitrogen gas pipe 27. The valve 27V is opened, and thus it is possible to discharge the nitrogen gas from the nitrogen gas discharge port 26a.

One end of the upper processing liquid pipe 24 is disposed to be substantially flush with the lower surface of the interruption plate 21, and thereby forms an upper processing liquid nozzle 25 that discharges the processing liquid.

The other end of the upper processing liquid pipe 24 forms a fluid introduction portion 24a for introducing the processing liquid and the nitrogen gas. A mixing valve MV2 is connected to the fluid introduction portion 24a. The chemical liquid pipe 16, the rinse liquid pipe 17 and the nitrogen gas pipe 18 are connected to the mixing valve MV2. The interior of the upper processing liquid pipe 24, the interior of the chemical liquid pipe 16, the interior of the rinse liquid pipe 17 and the interior of the nitrogen gas pipe 18 communicate with each other through the interior of the mixing valve MV2.

In the chemical liquid pipe 16, a valve 16V2 is interposed in the vicinity of a connection portion to the mixing valve MV2. The valve 16V2 is opened, and thus the chemical liquid flowing through the chemical liquid pipe 16 can be introduced through the mixing valve MV2 into the upper processing liquid pipe 24. In the rinse liquid pipe 17, a valve 17V2 is interposed in the vicinity of a connection portion to the mixing valve MV1. The valve 17V2 is opened, and thus the rinse liquid flowing through the rinse liquid pipe 17 can be introduced through the mixing valve MV2 into the upper processing liquid pipe 24. In the nitrogen gas pipe 18, a valve 18V2 is interposed in the vicinity of a connection portion to the mixing valve MV2. The valve 18V2 is opened, and thus the nitrogen gas can be introduced into the upper processing liquid pipe 24. By the valves 16V2, 17V2 and 18V2, the fluid that is introduced into the upper processing liquid pipe 24 can be switched between the chemical liquid, the rinse liquid and the nitrogen gas.

The valves 17V2 and 18V2 are closed and the valve 16V2 is opened, and thus only the chemical liquid is supplied into the upper processing liquid pipe 24, and the chemical liquid is discharged from the upper processing liquid nozzle 25. The valves 16V2 and 18V2 are closed and the valve 17V2 is opened, and thus only the rinse liquid is supplied into the upper processing liquid pipe 24, and the rinse liquid is discharged from the upper processing liquid nozzle 25. The valves 16V2 and 17V2 are closed and the valve 18V2 is opened, and thus only the nitrogen gas is supplied into the upper processing liquid pipe 24. In a state where the processing liquid is present within the upper processing liquid pipe 24 and within the upper processing liquid nozzle 25 (hereinafter referred to as "within the upper processing liquid pipe 24 and the upper processing liquid nozzle 25"), the nitrogen gas is supplied into the upper processing liquid pipe 24, and thus the processing liquid within the upper processing liquid pipe 24 and the upper processing liquid nozzle 25 is extruded by the nitrogen gas, with the result that the processing liquid can be discharged from the upper processing liquid nozzle 25.

The valve 18V2 includes a valve body within which a valve seat is provided, a valve member which opens and closes the valve seat and an actuator which moves the valve member between an opened positon and a closed position. The valve member is moved between the opened position and the closed position, and thus the opening and closing of the valve 18V2 are switched. The position of the opened positon of the valve member is changed, and thus the opening (the gap between the valve member and the valve seat in the opened position) of the valve 18V2 can be changed. The opening of the valve 18V2 is adjusted, and thus the flow rate of nitrogen gas supplied to the upper processing liquid pipe 24 can be adjusted.

An upper lift mechanism 33 is coupled to the rotation shaft 22 and the upper processing liquid pipe 24. By the upper lift mechanism 33, the rotation shaft 22 and the upper processing liquid pipe 24 can be simultaneously raised and lowered. Below the splash guard 4, a notch-shaped first guide portion 4a that is opened obliquely downwardly to the side of the central axis of the splash guard 4 and an annular groove 4c that is provided by being cut inwardly of the first guide portion 4a in a vertical direction are formed over the entire circumference of the splash guard 4. In the upper portion of the inner surface (the side of the central axis) of the splash guard 4, a second guide portion 4b formed in the shape of a groove opened in the shape of the letter V inwardly (the side of the rotation shaft line of the spin chuck 3) in the horizontal direction is formed.

Below the splash guard 4, three cylindrical members 28a, 28b and 28c are provided on a bottom plate 36 so as to stand coaxially. The diameter of the cylindrical member 28a is greater than those of the cylindrical members 28b and 28c, and the diameter of the cylindrical member 28b is greater than that of the cylindrical member 28c. The cylindrical member 28a has a size that can accommodate the splash guard 4 inside.

The cylindrical member 28a and the cylindrical member 28b are used as a side wall, and thus a first collection tank (collection flow path) 30 is formed, and the cylindrical member 28b and the cylindrical member 28c are used as a side wall, and thus a second collection tank 29 is formed. To the bottom portions of the first and second collection tanks 30 and 29, first and second drainage pipes 32 and 31 for draining liquid therewithin are respectively connected.

A lower lift mechanism 34 is coupled to the splash guard 4, and the splash guard 4 can be held at an arbitrary height position. In this way, the splash guard 4 can be raised and lowered between a raised position (position shown in FIG. 1) and a lowered position (position shown in FIG. 2).

As shown in FIG. 1, when the splash guard 4 is in the raised position, the first guide portion 4a is located to the side of the wafer W held by the spin chuck 3. In this state, the processing liquid (the chemical liquid and/or the rinse liquid) supplied from the lower processing liquid nozzle 14 and/or the upper processing liquid nozzle 25 to the wafer W held by the spin chuck 3 and rotated by the lower rotation drive mechanism 8 receives the centrifugal force of the rotating wafer W so as to be dispersed to the side and is received by the first guide portion 4a. The processing liquid reaching the first guide portion 4a is guided by a first flow path P1, is passed downward by its weight, is passed through the first flow path P1 and is guided to the first collection tank 30. In this way, the processing liquid removed from the wafer W is collected in the first collection tank 30.

On the other hand, as shown in FIG. 2, when the splash guard 4 is in the lowered position, the splash guard 4 is almost accommodated within the cylindrical member 28a, and the annular groove 4c of the splash guard 4 is fitted to the upper portion of the cylindrical member 28b. Here, the second guide portion 4b is located to the side of the wafer W held by the spin chuck 3.

In this state, the processing liquid supplied from the lower processing liquid nozzle 14 and/or the upper processing liquid nozzle 25 to the wafer W held by the spin chuck 3 and rotated by the lower rotation drive mechanism 8 receives the centrifugal force of the rotating wafer W so as to be dispersed to the side and is received by the second guide portion 4b. The processing liquid reaching the second guide portion 4b is guided by a second flow path P2, is passed downward by its weight, is passed through the second flow path P2 and is guided to the second collection tank 29. In this way, the processing liquid removed from the wafer W is collected in the second collection tank 29.

In this way, the splash guard 4 is raised and lowered, and thus the destination to which the processing liquid is dispersed from the peripheral edge of the wafer W can be switched between the first flow path P1 and the second flow path P2, with the result that these processing liquid can be separately discharged from the first and second drainage pipes 32 and 31. In the processing performed by the substrate processing apparatus 1, the processing liquid collected in the second collection tank 29 is passed through the first drainage pipe (collection flow path) 32 and is discarded, and the processing liquid collected in the first collection tank 30 is passed through the second drainage pipe 31 and is reused.

In the following description, the raised position (position shown in FIG. 1) of the splash guard 4, that is, the position of the splash guard 4 in which the processing liquid removed from the wafer W held by the spin chuck 3 is guided to the first collection tank 30 is referred to as a "collection position," and the lowered position (position shown in FIG. 1) of the splash guard 4, that is, the position of the splash guard 4 in which the processing liquid removed from the wafer W held by the spin chuck 3 is guided to the second collection tank 29 is referred to as a "discarded position."

The substrate processing apparatus 1 includes a control unit 35. The control unit 35 includes a computer. The control unit 35 includes an unillustrated storage device. In the control unit 35, recipes (programs) for performing the substrate processing are stored. The control unit 35 controls, based on the details of the recipes stored in the control unit 35, the operations of the rotation drive mechanisms 8 and 23 and the lift mechanisms 33 and 34. The control unit 35 also opens and closes, based on the details of the recipes stored in the control unit 35, the valves 12V, 16V1, 16V2, 17V1, 17V2, 18V1, 18V2 and 27V. Furthermore, the control unit 35 adjusts, based on the details of the recipes stored in the control unit 35, the openings of the valves 18V1 and 18V2.

In the present invention, as will be described later, the timing at which the valve 18V1 is opened and closed and the opening are controlled such that when the processing liquid within the lower processing liquid pipe 10 and the lower processing liquid nozzle 14 is extruded by the nitrogen gas, the processing liquid within the upper processing liquid pipe 24 and the lower processing liquid nozzle 14 is prevented from being completely removed.

In the present invention, as will be described later, the timing at which the valve 18V2 is opened and closed and the opening are controlled such that when the processing liquid within the upper processing liquid pipe 24 and the upper processing liquid nozzle 25 is extruded by the nitrogen gas, the processing liquid within the upper processing liquid pipe 24 and the upper processing liquid nozzle 25 is prevented from being completely removed.

Figure 3:
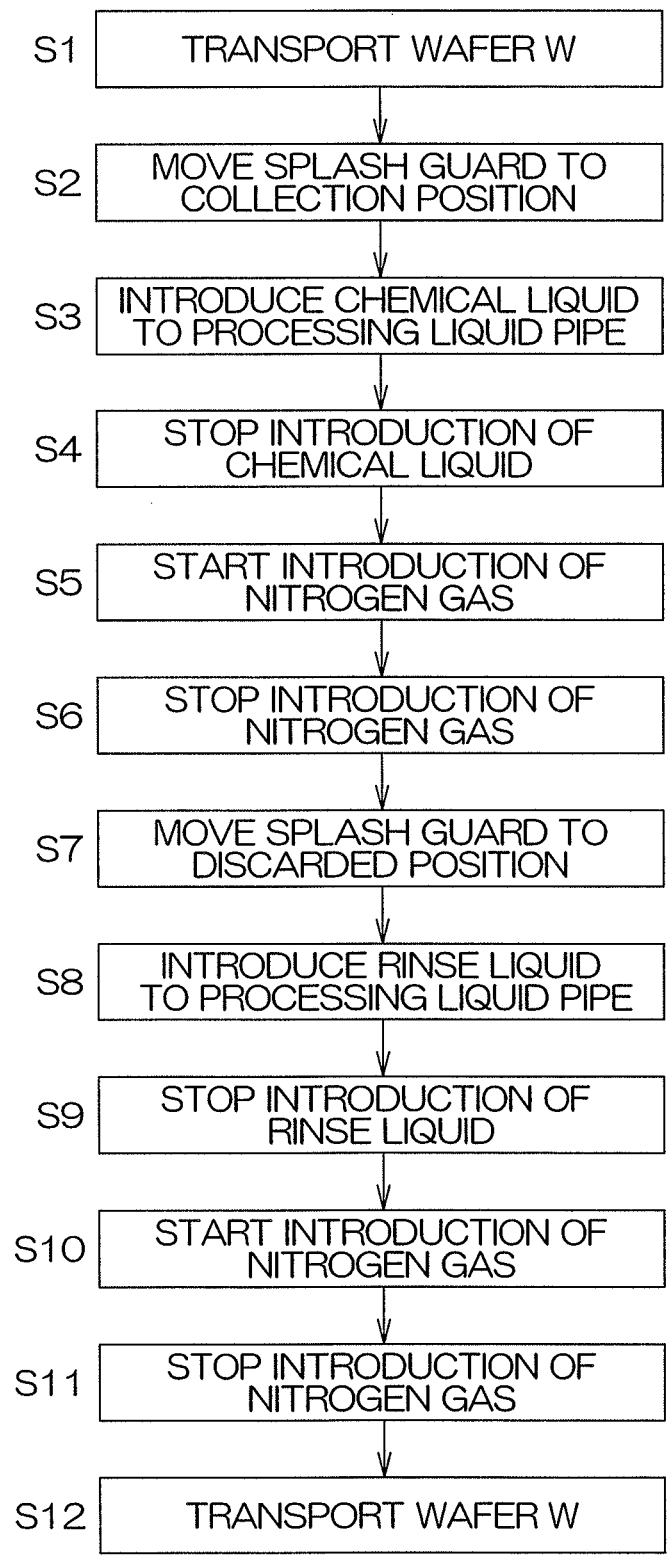
FIG. 3 is a flowchart for describing wafer processing with the substrate processing apparatus shown in FIGS. 1 and 2.

FIG. 3 is a flowchart for illustrating a method of processing the wafer W with the substrate processing apparatus 1. The substrate processing will be described with reference to FIGS. 1 to 3.

The control unit 35 closes the valves 16V1, 16V2, 17V1, 17V2, 18V1 and 18V2, and opens valves 12V and 27V. In this way, the processing liquid is not discharged from the lower processing liquid nozzle 14 and the upper processing liquid nozzle 25 but the nitrogen gas is discharged from the nitrogen gas discharge ports 11a and 26a. For example, the nitrogen gas is discharged at a flow rate of about 50 to 100 liters/min. In this state, within the processing liquid pipes 10 and 24, the lower processing liquid nozzle 14 and the upper processing liquid nozzle 25, no liquid such as the rinse liquid is present. The splash guard 4 is disposed in a position further below the discarded position (see FIG. 2).

In this state, an unprocessed wafer W is transported into the chamber 2 with an unillustrated robot hand (step S1), and the wafer W is held by the spin chuck 3 in a substantially horizontal position.

Thereafter, the control unit 35 controls the lower lift mechanism 34 to raise the splash guard 4 toward the collection position (see FIG. 1) (step S2). The control unit 35 controls the lower rotation drive mechanism 8 to rotate the wafer W held by the spin chuck 3 about the predetermined rotation shaft line.

Then, the control unit 35 opens the valves 16V1 and 16V2. In this way, the chemical liquid is introduced from the fluid introduction portions 10a and 24a into the processing liquid pipes 10 and 24 (step S3). Thus, the chemical liquid is discharged from the lower processing liquid nozzle 14 and the upper processing liquid nozzle 25 to the wafer W (chemical liquid discharge step (processing liquid discharge step)). The chemical liquid discharged from the lower processing liquid nozzle 14 is supplied to the vicinity of the center portion of the lower surface of the wafer W held by the spin chuck 3, receives the centrifugal force produced by the rotation of the wafer W and is spread toward the peripheral edge portion of the lower surface of the wafer W. The chemical liquid discharged from the upper processing liquid nozzle 25 is supplied to the vicinity of the center portion of the lower surface of the wafer W held by the spin chuck 3, receives the centrifugal force produced by the rotation of the wafer W and is spread toward the peripheral edge portion of the upper surface of the wafer W. In this way, the entire surface of the lower surface of the wafer W and the entire surface of the upper surface of the wafer W are more uniformly processed by the chemical liquid.

The chemical liquid reaching the peripheral edge portion of the wafer W receives the centrifugal force of the rotating wafer W, is dispersed to the side and is received by the first guide portion 4a. The chemical liquid reaching the first guide portion 4a is passed downward and is collected in the first collection tank 30. Before the introduction of the chemical liquid, within the processing liquid pipes 10 and 24, the lower processing liquid nozzle 14 and the upper processing liquid nozzle 25, no liquid such as the rinse liquid is present. Hence, another liquid such as the rinse liquid is prevented from being mixed with the chemical liquid collected in the first collection tank 30.

When a predetermined time has elapsed since the introduction of the chemical liquid to the processing liquid pipes 10 and 24, the control unit 35 closes the valves 16V1 and 16V2. In this way, the introduction of the chemical liquid to the processing liquid pipes 10 and 24 is stopped (step S4). In this state, the chemical liquid is left in the entire regions within the processing liquid pipes 10 and 24, the lower processing liquid nozzle 14 and the upper processing liquid nozzle 25.

After the stop of the introduction of the chemical liquid to the processing liquid pipes 10 and 24, the control unit 35 opens the valves 18V1 and 18V2. In this way, the introduction of the nitrogen gas from the fluid introduction portions 10a and 24a into the processing liquid pipes 10 and 24 is started (step S5). In this way, a gas extrusion step (S5 and S6) is started.

The nitrogen gas is introduced to the lower processing liquid pipe 10, and thus the chemical liquid left within the lower processing liquid pipe 10 and the lower processing liquid nozzle 14 is extruded, and the chemical liquid is discharged upwardly from the discharge port 14a of the lower processing liquid nozzle 14. The chemical liquid discharged from the lower processing liquid nozzle 14 flows on the lower surface of the rotating wafer W.

The nitrogen gas is introduced to the upper processing liquid pipe 24, and thus the chemical liquid left within the upper processing liquid pipe 24 and the upper processing liquid nozzle 25 is extruded, and the chemical liquid is discharged downwardly from the discharge port 25a of the upper processing liquid nozzle 25. The chemical liquid discharged from the upper processing liquid nozzle 25 flows on the upper surface of the rotating wafer W or on the upper surface of the spin base 5.

Then, the chemical liquid reaching the peripheral edge portion of the wafer W receives the centrifugal force, is dispersed to the side, is received by the first guide portion 4a and is then collected in the first collection tank 30. Another liquid such as the rinse liquid is prevented from being mixed with the chemical liquid extruded by the nitrogen gas. Hence, even when the chemical liquid is collected in the first collection tank 30, another liquid such as the rinse liquid is prevented from being mixed into the first collection tank 30.

As described above, the chemical liquid collected in the first collection tank 30 in step S3 is suitable for reuse, is fed through the first drainage pipe 32 to a chemical liquid cabinet and is then supplied to the chemical liquid supply source 19 again. Some kinds of chemical liquid are expensive. Such chemical liquid are collected and reused, and thus it is possible to reduce the operation cost.

When a predetermined time has elapsed since the opening of the valve 18V1, the control unit 35 closes the valve 18V1. In this way, the introduction of the nitrogen gas into the lower processing liquid pipe 10 is stopped (step S6, a gas introduction stop step). The predetermined time is a time set such that conditions in which in a state where the chemical liquid is not completely discharged from the lower processing liquid pipe 10 and the lower processing liquid nozzle 14, the introduction of the nitrogen gas is stopped are satisfied. The value of the predetermined time is stored in the storage device of the control unit 35. The control unit 35 reads the value of the predetermined time before the closing of the valve 18V1.

Here, the amount of chemical liquid left within the lower processing liquid pipe 10 and the lower processing liquid nozzle 14 is preferably low. For example, as shown in FIG.

Figure 4A:
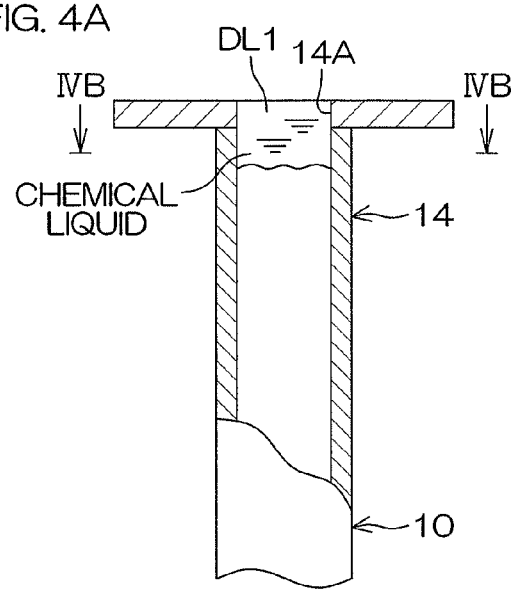
FIG. 4A is a vertical cross-sectional view of a lower processing liquid nozzle after the completion of a gas extrusion step.
Figure 4B:
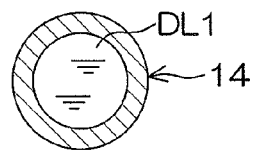
FIG. 4B is a cross-sectional view taken along line IVB-IVB in FIG. 4A.

4A, the chemical liquid is preferably left only in the vicinity (the tip end portion) of the discharge port 14*a* of the lower processing liquid nozzle 14. In this case, as shown in FIG. 4B, the chemical liquid forms a first liquid reservoir DL1. The first liquid reservoir DL1 covers the entire region of a cross section of the nozzle pipe (the discharge port 14*a*) of the lower processing liquid nozzle 14.

When a predetermined time has elapsed since the opening of the valve 18V2, the control unit 35 closes the valve 18V2. In this way, the introduction of the nitrogen gas into the upper processing liquid pipe 24 is stopped (step S6, the gas introduction stop step). The predetermined time is a time set such that conditions in which in a state where the chemical liquid is not completely discharged from the upper processing liquid pipe 24 and the upper processing liquid nozzle 25, the introduction of the nitrogen gas is stopped are satisfied. The value of the predetermined time is stored in the storage device of the control unit 35. The control unit 35 reads the value of the predetermined time before the closing of the valve 18V2.

Figure 5A:
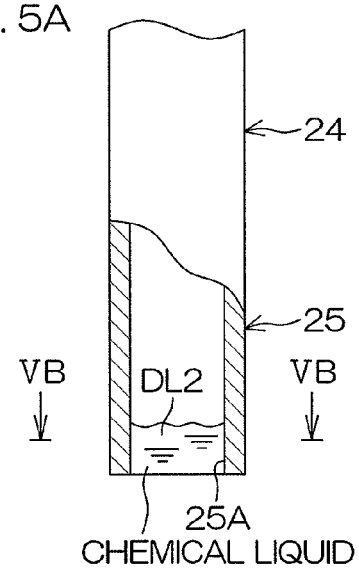
FIG. 5A is a vertical cross-sectional view of an upper processing liquid nozzle after the completion of the gas extrusion step.
Figure 5B:
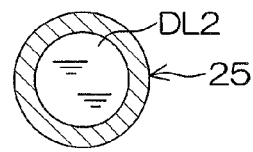
FIG. 5B is a cross-sectional view taken along line VB-VB in FIG. 5A.

Here, the amount of chemical liquid left within the upper processing liquid pipe 24 and the upper processing liquid nozzle 25 is preferably low. For example, as shown in FIG. 5A, the chemical liquid is preferably left only in the vicinity (the tip end portion) of the discharge port 25*a* of the upper processing liquid nozzle 25. In this case, as shown in FIG. 5B, the chemical liquid forms a second liquid reservoir DL2. The second liquid reservoir DL2 covers the entire region of a cross section of the nozzle pipe (the discharge port 25*a*) of the upper processing liquid nozzle 25.

In step S6, the timing at which the valves 18V1 and 18V2 are closed may be the same as or different from each other.

The introduction of the nitrogen gas into the processing liquid pipes 10 and 24 is stopped (step S6), and thus the gas extrusion step is completed.

For example, in Japanese Unexamined Patent Application Publication No. 2005-302746, in a step of discharging the chemical liquid and the like by the introduction of the nitrogen gas from the processing liquid pipes 10 and 24, the lower processing liquid nozzle 14 and the upper processing liquid nozzle 25, with consideration given to the throughput of the extrusion of the chemical liquid, the linear flow rate of nitrogen gas is set at about 1 to 2 m/sec.

However, in the preferred embodiment of the present invention, as described above, it is necessary to accurately control the introduction of the nitrogen gas such that the introduction of the nitrogen gas is stopped in a state where the chemical liquid is not completely discharged from the interiors of the lower processing liquid pipe 10 and the lower processing liquid nozzle 14. It is also necessary to accurately control the introduction of the nitrogen gas such that the introduction of the nitrogen gas is stopped in a state where the chemical liquid is not completely discharged from the upper processing liquid pipe 24 and the upper processing liquid nozzle 25. Hence, even if the throughput of the extrusion of the chemical liquid is sacrificed to some extent, the openings of the valves 18V1 and 18V2 in the gas extrusion step (S5 and S6) are preferably set such that the linear flow rate of the nitrogen gas is lowered.

On the other hand, when the openings of the valves 18V1 and 18V2 are excessively low, and the linear flow rate of nitrogen gas is excessively low, this can disadvantageously cause significant variations in the linear flow rate and a decrease in the throughput of the extrusion of the chemical liquid. Hence, the balances of the conditions described above are experimentally grasped, and appropriate openings of the valves 18V1 and 18V2 in the gas extrusion step (S5 and S6) are previously stored in the storage device of the control unit 35. The control unit 35 reads these openings before the closing of the valves 18V1 and 18V2.

In recent years, the performance of valves including the degree of accuracy of opening/closing response has been enhanced. Hence, the openings of the valves 18V1 and 18V2 in the gas extrusion step (S5 and S6) are set low, and the time that has elapsed since the start of the introduction of the nitrogen gas until the stop of the introduction is set appropriately, and thus it is possible to perform the gas extrusion step (S5 and S6) such that the chemical liquid is left only in the vicinity (the tip end portion) of the discharge ports 14*a* and 25*a* of the lower processing liquid nozzle 14 and the upper processing liquid nozzle 25. In this case, it is possible to prevent the nitrogen gas from being blown onto the wafer W from the lower processing liquid nozzle 14 and the upper processing liquid nozzle 25, and it is also possible to discharge most of the chemical liquid left in the processing liquid pipes 10 and 24, the lower processing liquid nozzle 14 and the upper processing liquid nozzle 25.

The liquid reservoirs DL1 and DL2 of the chemical liquid left in the vicinity of the discharge ports 14*a* and 25*a* of the lower processing liquid nozzle 14 and the upper processing liquid nozzle 25 respectively cover the entire regions of the cross sections of the nozzle pipes (the discharge ports 14*a* and 25*a*). Hence, the liquid reservoirs DL1 and DL2 also function as a so-called lid or liquid seal for preventing each of the nitrogen gas within the lower processing liquid nozzle 14 and the nitrogen gas within the upper processing liquid nozzle 25 from leaking to the outside of the pipes. Hence, until the rinse liquid is introduced to the processing liquid pipes 10 and 24 in subsequent step S8, the nitrogen gas is prevented from leaking to the outside of the pipes. In other words, the nitrogen gas is prevented from leaking to the wafer W.

Then, the control unit 35 controls the lower lift mechanism 34 to lower the splash guard 4 from the collection position (see FIG. 1) to the discarded position (see FIG. 2) (step S7).

While the splash guard 4 is being lowered, the chemical liquid is left in the vicinity of the discharge ports 14*a* and 25*a* of the lower processing liquid nozzle 14 and the upper processing liquid nozzle 25, and this chemical liquid functions as the so-called lid of the nitrogen gas. Hence, it is possible to prevent the nitrogen gas present within the lower processing liquid pipe 10 and the lower processing liquid nozzle 14 from leaking to the outside of the lower processing liquid nozzle 14. It is also possible to prevent the nitrogen gas present within the upper processing liquid pipe 24 and the upper processing liquid nozzle 25 from leaking to the outside of the upper processing liquid nozzle 25.

Then, the control unit 35 opens the valves 17V1 and 17V2. In this way, the rinse liquid is introduced from the fluid introduction portions 10*a* and 24*a* into the processing liquid pipes 10 and 24 (step S8).

Here, the chemical liquid and the nitrogen gas left within the lower processing liquid pipe 10 and the lower processing liquid nozzle 14 are discharged from the lower processing liquid nozzle 14 to the outside so as to be extruded by the rinse liquid introduced to the lower processing liquid pipe 10. Specifically, the chemical liquid and the nitrogen gas are discharged to the lower surface of the wafer W. Following the chemical liquid and the nitrogen gas, the rinse liquid is discharged from the lower processing liquid nozzle 14 and is supplied to the lower surface of the wafer W.

Here, the chemical liquid and the nitrogen gas are supplied together with the rinse liquid to the wafer W. However, a relatively small amount of chemical liquid is left within the lower processing liquid pipe 10 and the lower processing liquid nozzle 14, and the chemical liquid is diluted with the following rinse liquid, with the result that the wafer W is hardly adversely affected by the supply of the chemical liquid left. Since the pressure of the nitrogen gas left within the lower processing liquid pipe 10 and the lower processing liquid nozzle 14 is not high, it is possible to practically ignore adverse effects such as the drying and contamination of the wafer W caused by the blowing of the nitrogen gas onto the wafer W.

The chemical liquid and the nitrogen gas left within the upper processing liquid pipe 24 and the upper processing liquid nozzle 25 are discharged from the upper processing liquid nozzle 25 to the outside so as to be extruded by the rinse liquid introduced to the upper processing liquid pipe 24. Specifically, the chemical liquid and the nitrogen gas are discharged to the upper surface of the wafer W. Following the chemical liquid and the nitrogen gas, the rinse liquid is discharged from the upper processing liquid nozzle 25 and is supplied to the upper surface of the wafer W.

Here, the chemical liquid and the nitrogen gas are supplied together with the rinse liquid to the wafer W. However, a relatively small amount of chemical liquid is left within the upper processing liquid pipe 24 and the upper processing liquid nozzle 25, and the chemical liquid is diluted with the following rinse liquid, with the result that the wafer W is hardly adversely affected by the supply of the chemical liquid left. Since the pressure of the nitrogen gas left within the upper processing liquid pipe 24 and the upper processing liquid nozzle 25 is not high, it is possible to practically ignore adverse effects such as the drying and contamination of the wafer W caused by the blowing of the nitrogen gas onto the wafer W.

The rinse liquid discharged from the lower processing liquid nozzle 14 is supplied to the vicinity of the center portion of the lower surface of the wafer W held by the spin chuck 3, receives the centrifugal force produced by the rotation of the wafer W and is spread toward the peripheral edge portion of the lower surface of the wafer W. In this way, the chemical liquid adhered to the lower surface of the wafer W is washed out by the rinse liquid (rinse liquid discharge step (processing liquid discharge step)).

Moreover, the rinse liquid discharged from the upper processing liquid nozzle 25 is supplied to the vicinity of the center portion of the upper surface of the wafer W held by the spin chuck 3, receives the centrifugal force produced by the rotation of the wafer W and is spread toward the peripheral edge portion of the upper surface of the wafer W. In this way, the chemical liquid adhered to the upper surface of the wafer W is washed out by the rinse liquid (rinse liquid discharge step (processing liquid discharge step)).

The rinse liquid reaching the peripheral edge portion of the wafer W receives the centrifugal force caused by the rotation of the wafer W, is dispersed to the side and is received by the second guide portion 4b. The rinse liquid reaching the second guide portion 4b is passed downward and is collected in the second collection tank 29. Since the rinse liquid collected in the second collection tank 29 contains the chemical liquid and contaminants, it is drained from the first drainage pipe 31 and is then discarded.

When a predetermined time has elapsed since the introduction of the rinse liquid to the processing liquid pipes 10 and 24, the control unit 35 closes the valves 17V1 and 17V2. In this way, the introduction of the rinse liquid to the processing liquid pipes 10 and 24 is stopped (step S9). In this state, the rinse liquid is left in the entire regions within the processing liquid pipes 10 and 24, the lower processing liquid nozzle 14 and the upper processing liquid nozzle 25.

After the stop of the introduction of the rinse liquid to the processing liquid pipes 10 and 24, the control unit 35 opens the valves 18V1 and 18V2. In this way, the introduction of the nitrogen gas from the fluid introduction portions 10a and 24a into the processing liquid pipes 10 and 24 is started (step S10). In this way, a gas extrusion step (S10 and S11) is started.

The nitrogen gas is introduced to the lower processing liquid pipe 10, and thus the rinse liquid left within the lower processing liquid pipe 10 and the lower processing liquid nozzle 14 is extruded, and the rinse liquid is discharged upwardly from the discharge port 14a of the lower processing liquid nozzle 14. The rinse liquid discharged from the lower processing liquid nozzle 14 flows on the lower surface of the rotating wafer W.

The nitrogen gas is introduced to the upper processing liquid pipe 24, and thus the rinse liquid left within the upper processing liquid pipe 24 and the upper processing liquid nozzle 25 is extruded, and the rinse liquid is discharged downwardly from the discharge port 25a of the upper processing liquid nozzle 25. The rinse liquid discharged from the upper processing liquid nozzle 25 flows on the upper surface of the rotating wafer W or on the upper surface of the spin base 5.

Then, the rinse liquid reaching the peripheral edge portion of the wafer W receives the centrifugal force, is dispersed to the side, is received by the second guide portion 4b and is then collected in the second collection tank 29.

When a predetermined time has elapsed since the opening of the valve 18V2, the control unit 35 closes the valve 18V2. In this way, the introduction of the nitrogen gas into the lower processing liquid pipe 10 is stopped (step S11). The predetermined time is a time set in advance such that conditions in which in a state where the rinse liquid is not completely discharged from the lower processing liquid pipe 10 and the lower processing liquid nozzle 14, the introduction of the nitrogen gas is stopped are satisfied. The value of the predetermined time is stored in the storage device of the control unit 35. The control unit 35 reads the value of the predetermined time before the closing of the valve 18V2.

Here, the amount of rinse liquid left within the lower processing liquid pipe 10 and the lower processing liquid nozzle 14 is preferably low. For example, as in the case of step S10, the rinse liquid is preferably left only in the vicinity (the tip end portion) of the discharge port 14a (see FIG. 4A) of the lower processing liquid nozzle 14. In this case, as in the case of step S10, the rinse liquid forms a liquid reservoir (equivalent to the first liquid reservoir DL1). The liquid reservoir covers the entire region of a cross section of the nozzle pipe (the discharge port 14a) of the lower processing liquid nozzle 14.

When a predetermined time has elapsed since the opening of the valve 18V2, the control unit 35 closes the valve 18V2. In this way, the introduction of the nitrogen gas into the upper processing liquid pipe 24 is stopped (step S11). The predetermined time is a time set in advance such that conditions in which in a state where the rinse liquid is not completely discharged from the upper processing liquid pipe 24 and the upper processing liquid nozzle 25, the introduction of the nitrogen gas is stopped are satisfied. The value of the predetermined time is stored in the storage device of the control unit 35. The control unit 35 reads the value of the predetermined time before the closing of the valve 18V2.

Here, the amount of rinse liquid left within the upper processing liquid pipe 24 and the upper processing liquid nozzle 25 is preferably low. For example, as in the case of step S6, the rinse liquid is preferably left only in the vicinity (the tip end portion) of the discharge port 25a (see FIG. 5A) of the upper processing liquid nozzle 25. In this case, as in the case of step S6, the rinse liquid forms a liquid reservoir (equivalent to the second liquid reservoir DL2). The liquid reservoir covers the entire region of a cross section of the nozzle pipe (the discharge port 25a) of the upper processing liquid nozzle 25.

In step S11, the timing at which the valves 18V1 and 18V2 are closed may be the same as or different from each other.

In the gas extrusion step (S10 and S11), as in the case of the gas extrusion step (S5 and S6), the openings of the valves 18V1 and 18V2 are preferably low such that significant variations in the nitrogen gas and a decrease in the throughput of the extrusion of the rinse liquid are disadvantageously produced. Hence, the balances of the conditions described above are experimentally grasped, and appropriate openings of the valves 18V1 and 18V2 in the gas extrusion step (S10 and S11) are previously stored in the storage device of the control unit 35. The control unit 35 reads these openings before the closing of the valves 18V1 and 18V2.

In recent years, the performance of valves including the degree of accuracy of opening/closing response has been enhanced. Hence, the openings of the valves 18V1 and 18V2 in the gas extrusion step (S10 and S11) are set low, and the time that has elapsed since the start of the introduction of the nitrogen gas until the stop of the introduction is set appropriately, and thus it is possible to perform the gas extrusion step (S10 and S11) such that the rinse liquid is left only in the vicinity (the tip end portion) of the discharge ports 14a and 25a of the lower processing liquid nozzle 14 and the upper processing liquid nozzle 25. In this case, it is possible to prevent the nitrogen gas from being blown onto the wafer W from the lower processing liquid nozzle 14 and the upper processing liquid nozzle 25, and it is also possible to discharge most of the rinse liquid left in the processing liquid pipes 10 and 24, the lower processing liquid nozzle 14 and the upper processing liquid nozzle 25.

As described above, in the cases of the gas extrusion step (S5 and S6) and the gas extrusion step (S10 and S11), in the same method, the control unit 35 opens and closes the valves 18V1 and 18V2 and adjusts the openings thereof. However, the chemical liquid and the rinse liquid differ in physical properties such as viscosity. Hence, in each of the cases of the gas extrusion step (S5 and S6) and the gas extrusion step (S10 and S11), the optimum opening and the optimum time that has elapsed since the start of the introduction of the nitrogen gas until the stop of the introduction are set.

The liquid reservoirs of the rinse liquid left in the vicinity of the discharge ports 14a and 25a of the lower processing liquid nozzle 14 and the upper processing liquid nozzle 25 respectively cover the entire regions of the cross sections of the nozzle pipes (the discharge ports 14a and 25a). Hence, the liquid reservoirs of the rinse liquid also function as a so-called lid or liquid seal for preventing each of the nitrogen gas within the lower processing liquid nozzle 14 and the nitrogen gas within the upper processing liquid nozzle 25 from leaking to the outside of the pipes. Hence, until the rinse liquid is introduced to the processing liquid pipes 10 and 24 in subsequent step S8, the nitrogen gas is prevented from leaking to the outside of the pipes. In other words, the nitrogen gas is prevented from leaking to the wafer W.

After the completion of a series of processing steps (S1 to S12) on one wafer W and until the start of the series of processing steps (S1 to S12) on the wafer W to be subsequently processed, it is possible to prevent contaminants from entering from the discharge port 14a of the lower processing liquid nozzle 14 and the discharge port 25a of the upper processing liquid nozzle 25.

Following the rinse liquid step in steps S9 to S12, an atmosphere within the chamber 2 may need to be an atmosphere of nitrogen gas. In this case, in step S11, the nitrogen gas may be introduced until the rinse liquid is completely removed from the lower processing liquid nozzle 14 and the upper processing liquid nozzle 25, and furthermore, then the introduction of the nitrogen gas may be continued until the atmosphere within the chamber 2 is sufficiently converted into an atmosphere of nitrogen gas.

After the completion of the rinse processing, the control unit 35 controls the lower rotation drive mechanism 8 to increase the rotation speed of the spin chuck 3. The control unit 35 also controls the upper rotation drive mechanism 23 to rotate the interruption plate 21 in the same direction as the spin chuck 3 at substantially the same rotation speed. In this way, the wafer W is dried by being shaken. Thereafter, the control unit 35 controls the rotation drive mechanisms 8 and 23 to stop the rotation of the spin chuck 3 and the interruption plate 21.

Then, the control unit 35 controls the upper lift mechanism 33 to raise the interruption plate 21 and the upper processing liquid nozzle 25. Thereafter, with the unillustrated robot hand, the wafer W is transported from the chamber 2 (step S12), and the chemical liquid processing and the rinse processing on one wafer W are completed. On the subsequent wafer W, steps S1 to S12 described above are performed in the same manner.

Figure 6:
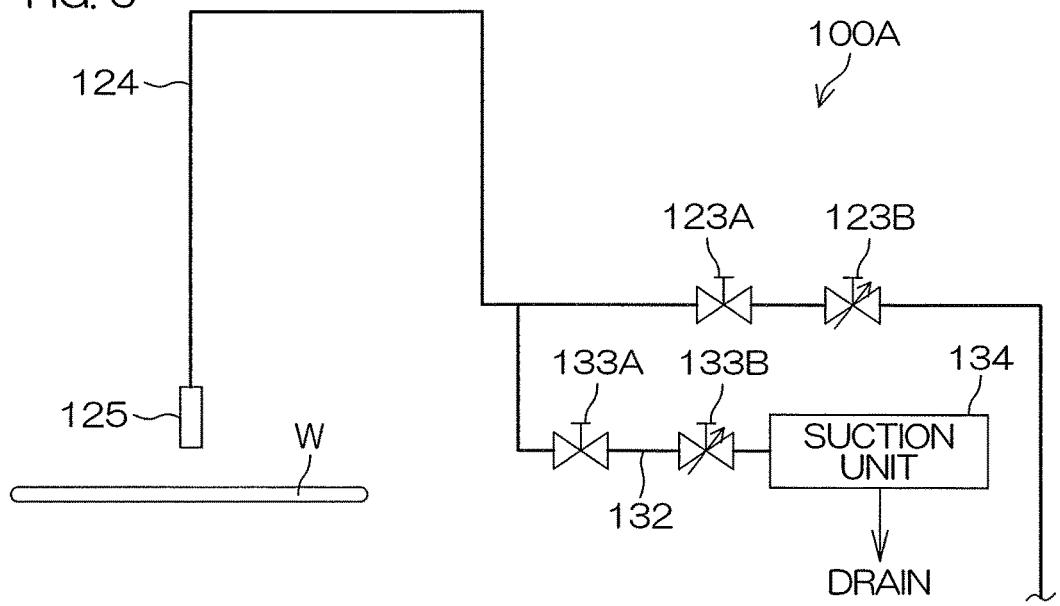
FIG. 6 is a schematic cross-sectional view of the main portion of a substrate processing apparatus according to another embodiment.

FIG. 6 is a schematic cross-sectional view of the main portion of a substrate processing apparatus 100A according to another embodiment. In the substrate processing apparatus, a processing liquid pipe 124 connected to a processing liquid nozzle 125 is branched into a processing liquid suction pipe 132. When the wafer W is processed, in a state where the processing liquid nozzle 125 is disposed above the wafer W, a valve 133A interposed in the processing liquid suction pipe 132 is closed, and all valves 123A and 123B interposed in the processing liquid pipe 124 are opened. In this way, the processing liquid is distributed within the processing liquid pipe 124 from the other end of the processing liquid nozzle 125 in the processing liquid pipe 124 toward the processing liquid nozzle 125, and is supplied from the end portion of the processing liquid nozzle 125 to the wafer W.

After the processing, within the processing liquid nozzle 125 and the processing liquid pipe 124, the processing liquid is left. The leftover processing liquid, particularly, the processing liquid left within the processing liquid nozzle 125 may drip downwardly of the processing liquid nozzle 125 by gravity from the end portion of the processing liquid nozzle 125 or an action of the pressure of the processing liquid left within the processing liquid pipe 124, that is, a so-called liquid dripping phenomenon may occur. The liquid dripping phenomenon described above causes the contamination of the wafer W when the wafer W is located below the processing liquid nozzle 125. Since even when the wafer W is not located below the processing liquid nozzle 125, the liquid dripping causes the contamination of the apparatus, it is preferable to avoid the occurrence thereof.

One way to avoid the liquid dripping is so-called suck-back processing (the suck-back processing is also disclosed in Japanese Examined Patent Application Publication No. 5030767). As shown in FIG. 6, in a state where the valve 123A interposed in the processing liquid pipe 125 is closed, the valves 133A and 133B on the processing liquid suction pipe 132 are opened. In this state, a suction unit 134 such as a suction pump is operated, and thus the processing liquid left within the processing liquid nozzle 125 and the processing liquid pipe 124 is sucked through the processing liquid suction pipe 132 and is drained into an unillustrated drain facility connected to the suction unit 134 (suck-back processing).

An arrangement may be adopted in which in the suction unit 134, an unillustrated processing liquid collection mechanism is provided to reuse the sucked processing liquid.

By the suck-back processing described above, it is possible to avoid the liquid dripping described above. It is also possible to reuse the sucked processing liquid. However, disadvantageously, it takes a relatively long time to perform the suck-back processing. It may be difficult to stably exert a suction force caused by the suction unit 134 such as a suction pump.

Figure 7:
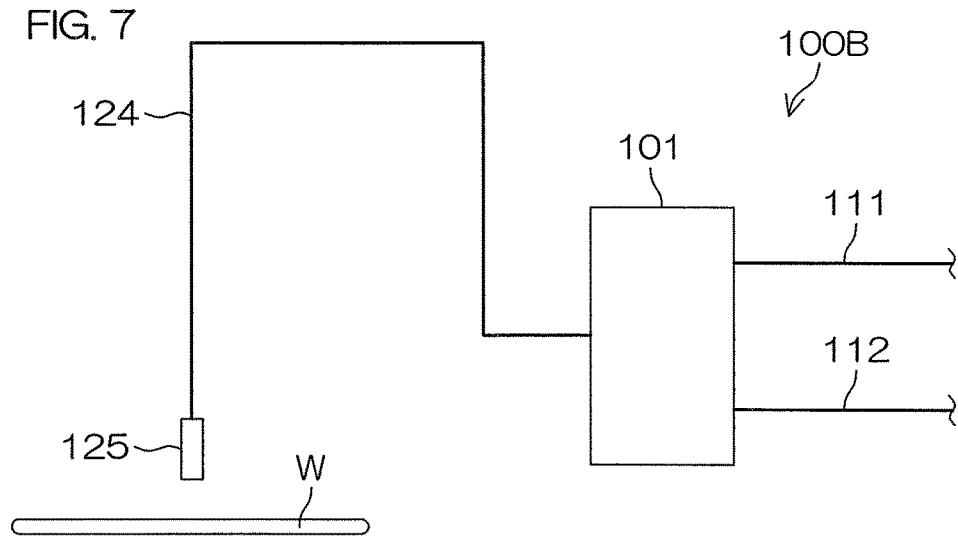
FIG. 7 is a schematic cross-sectional view of the main portion of a substrate processing apparatus according to yet another embodiment.

FIG. 7 is a schematic cross-sectional view of the main portion of a substrate processing apparatus 100B according to yet another embodiment.

Another method (extrusion processing by the introduction of nitrogen) of removing the processing liquid left within the processing liquid nozzle 125 and the processing liquid nozzle 124 will be described with reference to FIG. 7.

In this method, a multiple valve 101 is connected to the processing liquid pipe 124. A nitrogen pipe 111 and a processing liquid pipe 112 are connected to the multiple valve 101. The interior of the processing liquid pipe 124, the interior of the nitrogen pipe 111 and the interior of the processing liquid pipe 112 communicate with each other through the interior of the multiple valve 101. When the processing liquid is left within the processing liquid nozzle 125 and the processing liquid pipe 124, the multiple valve 101 is switched to make the processing liquid pipe 124 communicate with the nitrogen pipe 111, and thus the nitrogen gas is introduced through the nitrogen pipe 111 into the processing liquid pipe 124. In this way, the processing liquid left within the processing liquid nozzle 125 and the processing liquid pipe 124 is discharged from the end portion of the processing liquid nozzle 125.

While the nitrogen pipe 111 is closed by the multiple valve 101, since the nitrogen gas filled in the nitrogen pipe 111 has a pressure exceeding a normal atmospheric pressure, the nitrogen pipe 111 is made to communicate with the processing liquid pipe 124 by an operation of the multiple valve, and thus nitrogen is introduced. When a predetermined time has elapsed since the introduction of the nitrogen gas, the communication between the interior of the nitrogen pipe 111 and the interior of the processing liquid pipe 124 is interrupted by an operation of the multiple valve 101. In this way, the introduction of the nitrogen gas is stopped, and thus the discharge of the nitrogen gas from the supply port of the processing liquid nozzle 125 is also stopped. The predetermined time is set at a time sufficient to completely remove the leftover processing liquid from the processing liquid nozzle 125 and the processing liquid pipe 124.

However, when the processing liquid is completely removed from the interiors of the processing liquid pipe 124 and the processing liquid nozzle 125, only the nitrogen gas is discharged from the discharge port of the processing liquid nozzle 125, and the nitrogen gas discharged from the discharge port is directly blown onto the main surface of the wafer W. Since the high-pressure nitrogen gas is directly blown onto the main surface of the wafer W, the main surface of the wafer W may be damaged. Consequently, it may lead to a decrease in the processing quality of the wafer W.

As described above, in the preferred embodiment, after the discharge of the processing liquid (the chemical liquid and the rinse liquid) from the discharge ports 14a and 25a of the processing liquid nozzles 14 and 25 to the wafer W is stopped, the nitrogen gas is introduced from the fluid introduction portions 10a and 24a into the processing liquid pipes 10 and 24, and thus the processing liquid within the processing liquid pipes 10 and 24 and the processing liquid nozzles 14 and 25 is extruded outwardly (the gas extrusion step (S5 and S6; S10 and S11)). In this case, in a state where the processing liquid is left on the tip end portions of the processing liquid nozzles 14 and 25, that is, before the processing liquid is completely extruded from the interiors of the processing liquid pipes 10 and 24 and the processing liquid nozzles 14 and 25, the introduction of the nitrogen gas into the processing liquid pipes 10 and 24 is stopped. Hence, in the gas extrusion step, it is possible to prevent the nitrogen gas introduced to the processing liquid pipes 10 and 24 from being directly blown onto the wafer W.

Since the processing liquid left in the vicinity (the tip end portion) of the discharge ports 14a and 25a of the processing liquid nozzles 14 and 25 functions as a so-called lid of the processing liquid nozzles 14 and 25, it is possible to prevent the nitrogen gas from leaking through the discharge ports 14a and 25a of the processing liquid nozzles 14 and 25.

In this method, in a state where the processing liquid is left on the tip end portions of the processing liquid nozzles 14 and 25, the introduction of the nitrogen gas into the processing liquid pipes 10 and 24 is stopped. Since the pipe length of the processing liquid pipes 10 and 24 is significantly longer than that of the nozzle pipes of the processing liquid nozzles 14 and 25, the volume of the processing liquid pipes 10 and 24 is larger than that of the nozzle pipes of the processing liquid nozzles 14 and 25. Since the processing liquid left on parts of the processing liquid pipes 10 and 24 and the processing liquid nozzles 14 and 25 other than the tip end portions of the processing liquid nozzles 14 and 25 is removed, after the completion of the gas extrusion step (S5 and S6; S10 and S11), on a large proportion of the processing liquid pipes 10 and 24 and the processing liquid nozzles 14 and 25, no processing liquid is present. In this way, it is possible to effectively reduce the liquid dripping of the processing liquid from the discharge ports 14a and 25a of the processing liquid nozzles 14 and 25.

Although the preferred embodiment of the present invention is described above, the present invention can also be carried out in other preferred embodiments.

For example, although in the preferred embodiment described above, the upper processing liquid nozzle 25 and the lower processing liquid nozzle 14 are fixed so as to be disposed on the center line of the wafer W, as the processing liquid nozzles 14 and 25, a scan-type may be adopted in which the position is moved along the upper surface or the lower surface of the wafer W. With these nozzles, it is possible to achieve the arrangement and the method of the present invention disclosed in the preferred embodiment described above.

Although in the preferred embodiment discussed above, the case where the openings of the valves 18V1 and 18V2 are changed to adjust the flow rate of nitrogen gas supplied to the processing liquid pipes 10 and 24 is described, an arrangement may be adopted in which only the opening and closing of the valves 18V1 and 18V2 can be switched but the openings cannot be changed. In this case, an opening adjustment valve for adjusting the flow rate of nitrogen gas supplied to the processing liquid pipes 10 and 24 by adjusting the opening of the nitrogen gas pipe 18 may be provided separately of the valves 18V1 and 18V2.

Although in the preferred embodiment described above, the openings of the valves 18V1 and 18V2 and the time that has elapsed since the start of the discharge of the processing liquid until the stop of the discharge are controlled to adjust the amount of nitrogen gas introduced in the gas extrusion step (S5 and S6; S10 and S11), by controlling only the time that has elapsed since the start of the discharge of the processing liquid until the stop of the discharge, the amount of nitrogen gas introduced in the gas extrusion step (S5 and S6; S10 and S11) may be adjusted.

Figure 8:
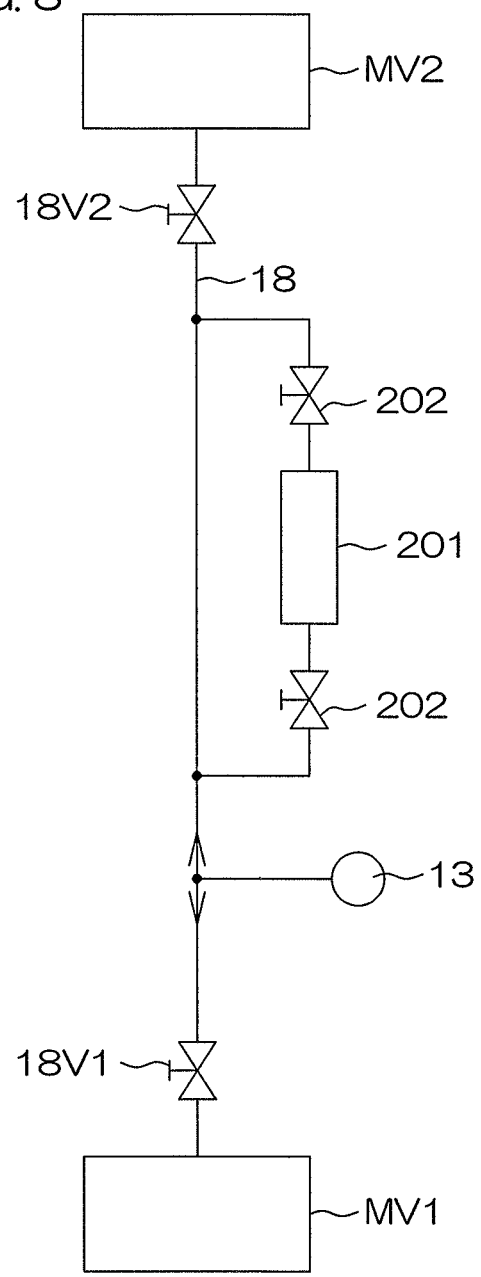
FIG. 8 is a diagram showing the main portion of a substrate processing apparatus according to a modification example.

As the method of introducing a predetermined amount of nitrogen gas, an arrangement can be adopted in which a pressure gas tank 201 independent of the gas supply source serving as the supply source is interposed on the pipe system (for example, the nitrogen gas pipe). In this case, as shown in FIG. 8, the pressure gas tank 201 is used that has a capacity lower than that of the supply source of the nitrogen gas or the like, that is, that has such a capacity as to store the amount of nitrogen gas necessary in the step of introducing the nitrogen gas.

In general, it is difficult to accurately perform control on the flow rate of nitrogen introduced from the nitrogen gas supply source 13 to the nitrogen gas pipe 18, particularly in a case where the flow rate thereof is low, it is difficult to accurately perform control on the pressure introduced and the amount introduced. Hence, in the nitrogen gas pipe 18, the pressure gas tank 201 is interposed which is independent of the nitrogen gas supply source 13, in which the nitrogen gas or the like is temporarily stored and which serves as one type of buffer tank. The pressure gas tank 201 is interposed in the nitrogen gas pipe 18 such that both ends thereof are connected through a tank valve 202 to the nitrogen gas pipe 18.

The control unit 35 switches between the introduction and the stop of the introduction of the nitrogen gas to the processing liquid pipes 10 and 24 by opening and closing the valves 18V1 and 18V2. However, it is difficult to control with a high degree of accuracy the amount of nitrogen gas introduced to the processing liquid pipes 10 and 24 by controlling the timing at which the valves 18V1 and 18V2 are opened and closed. The accurate control of the timing at which the valves 18V1 and 18V2 are opened and closed is limited in terms of the characteristics of the structure of a valve mechanism. Hence, it may be difficult to accurately control the amount of nitrogen gas introduced to the processing liquid pipes 10 and 24 by opening and closing the valves 18V1 and 18V2.

In contrast, in the present modification example, by controlling the inner pressure of the pressure gas tank 201 to open and close the tank valve 202 and thereby release the nitrogen gas inside the pressure gas tank 201 in the step of introducing the nitrogen gas, as compared with a case where the nitrogen gas is directly released from the nitrogen gas supply source 13, it is possible to control with a high degree of accuracy the amount of nitrogen gas introduced to the processing liquid pipes 10 and 24.

Although in the above description, in the gas extrusion step (S5 and S6; S10 and S11), after the start of the introduction of the nitrogen gas, in a state where the processing liquid is left on the tip end portions of the processing liquid nozzles 14 and 25, the introduction of the nitrogen gas into the processing liquid pipes 10 and 24 is stopped, the timing at which the introduction of the nitrogen gas is stopped is not limited to this, and the state where the processing liquid is left on at least part of the processing liquid pipes 10 and 24 (the state where the processing liquid is not completely removed from the interiors of the processing liquid pipes 10 and 24 and the processing liquid nozzles 14 and 25) is preferably achieved.

Although in the preferred embodiment described above, the example where the lower processing liquid nozzle 14 and the upper processing liquid nozzle 25 are provided is described, only one of the lower processing liquid nozzle 14 and the upper processing liquid nozzle 25 may be provided. In the case where only the upper processing liquid nozzle 25 is provided, the spin chuck 3 is not limited to a clamping type, and for example, a vacuum suction type (vacuum chuck) may be adopted in which the back surface of the wafer W is sucked in vacuum to hold the wafer W in a horizontal position, and furthermore, in this state, the spin chuck is rotated about a vertical rotation shaft line to rotate the wafer W held by the spin chuck 3.

Although in the preferred embodiment described above, as the gas for discharging the processing liquid from the interiors of the processing liquid pipes 10 and 24 and the interiors of the processing liquid nozzles 14 and 25, the nitrogen gas is used, as this gas, another inert gas such as cleaned air may be used.

A suction pipe (equivalent to the processing liquid suction pipe 132 of FIG. 6) may be connected as a branch halfway through the processing liquid pipes 10 and 24. In this case, a suction valve (equivalent to the valve 133A of FIG. 6) for interposing the suction pipe may be interposed in the suction pipe, and a suction unit (equivalent to the suction unit 133 of FIG. 6) may be interposed in the end portion on the side opposite to the branch side in the suction pipe. In the preferred embodiment described above, after the completion of the gas extrusion step (S5 and S6; S10 and S11), the processing liquid (the chemical liquid and the rinse liquid) is left on the tip end portions of the processing liquid pipes 10 and 24. In this case, the control unit 35 controls the suction valve and the suction unit so as to further perform a step of opening the suction valve for a short period of time to slightly move the leftover processing liquid to the side of the suction unit. In this way, while the advantage of the present invention in which the processing liquid is left on the tip end portions of the processing liquid pipes 10 and 24 is held, it is possible to reduce the possibility that the leftover processing liquid drips from the tip ends of the processing liquid nozzles 14 and 25.

Although in the preferred embodiment described above, as the substrate to be processed, the semiconductor wafer W is described, the substrate to be processed is not limited to the semiconductor wafer, and for example, other types of substrates such as a glass substrate for a liquid crystal display, a substrate for a plasma display, a substrate for an FED, a substrate for an optical disc, a substrate for a magnetic disc, a substrate for a magnetic optical disc, a substrate for a photomask, a ceramic substrate and a substrate for a solar cell may be used as the substrate to be processed.

Although the preferred embodiments of the present invention have been described in detail, these are simply specific examples used for clarifying the technical details of the present invention, the present invention should not be interpreted to be limited to the specific examples and the scope of the present invention is limited by only the scope of claims attached.

The present application corresponds to Japanese Patent Application No. 2014-198142 filed in Japan Patent Office on Sep. 29, 2014 and Japanese Patent Application No. 2015-159088 filed in Japan Patent Office on Aug. 11, 2015, and all the disclosure of this application is incorporated herein by reference.

What is claimed is:

1. A substrate processing method of performing processing using processing liquid on a substrate to be processed, the method comprising:
   a substrate holding step of holding the substrate in a horizontal position with a substrate holding and rotating mechanism;
   a processing liquid discharge step of introducing processing liquid from a fluid introduction portion of, in a processing liquid pipe in which a processing liquid nozzle having a discharge port at a tip end is provided at one end, the other end of the processing liquid pipe into the processing liquid pipe so as to discharge the processing liquid from the discharge port toward the substrate;
   a gas extrusion step of introducing, after stop of the processing liquid discharge step, a gas from the fluid introduction portion into the processing liquid pipe so as to extrude the processing liquid within the processing liquid pipe and within the processing liquid nozzle outwardly; and
   a gas introduction stop step of stopping, after the start of the introduction of the gas, the introduction of the gas into the processing liquid pipe in a state where the processing liquid is left within the processing liquid pipe and/or the processing liquid nozzle.

2. The substrate processing method according to claim 1, wherein in the gas introduction stop step, in a state where the processing liquid is left on the tip end portion of the processing liquid nozzle, the introduction of the gas into the processing liquid pipe is stopped.

3. The substrate processing method according to claim 1, the method further comprising:
   a processing liquid collection step of collecting, together with the gas extrusion step, from a collection flow path, the processing liquid removed from the substrate.

4. The substrate processing method according to claim 1, wherein the processing liquid contains a chemical liquid, and
   the substrate processing method further comprises a rinse liquid discharge step of introducing, after the gas introduction stop step, a rinse liquid from the fluid introduction portion into the processing liquid pipe so as to discharge the rinse liquid from the discharge port toward the substrate.

* * * * *